(12) United States Patent
Forsman

(10) Patent No.: US 8,305,223 B2
(45) Date of Patent: Nov. 6, 2012

(54) MULTI-OBJECT PROTECTION, CONTROL, AND MONITORING IN THE SAME INTELLIGENT ELECTRONIC DEVICE

(75) Inventor: Sören Forsman, Västerås (SE)

(73) Assignee: ABB Technology Ltd., Zürich (CH)

( * ) Notice: Subject to any disclaimer, the term of this patent is extended or adjusted under 35 U.S.C. 154(b) by 507 days.

(21) Appl. No.: 12/086,585

(22) PCT Filed: Dec. 15, 2006

(86) PCT No.: PCT/IB2006/004103
§ 371 (c)(1),
(2), (4) Date: Jun. 16, 2008

(87) PCT Pub. No.: WO2007/069096
PCT Pub. Date: Jun. 21, 2007

(65) Prior Publication Data
US 2010/0164734 A1    Jul. 1, 2010

Related U.S. Application Data

(60) Provisional application No. 60/750,388, filed on Dec. 15, 2005.

(51) Int. Cl.
*G08B 21/00*    (2006.01)

(52) U.S. Cl. ........................ 340/664; 340/635

(58) Field of Classification Search ................ 340/664, 340/635, 646, 657, 662, 644; 713/340
See application file for complete search history.

(56) References Cited

U.S. PATENT DOCUMENTS

| | | |
|---|---|---|
| 2004/0138834 A1 | 7/2004 | Blackett et al. |
| 2004/0172207 A1 | 9/2004 | Hancock et al. |
| 2004/0183522 A1* | 9/2004 | Gunn et al. .................... 324/126 |
| 2005/0015426 A1* | 1/2005 | Woodruff et al. ............. 709/200 |
| 2005/0097373 A1 | 5/2005 | Stoupis et al. |

OTHER PUBLICATIONS

PCT/ISA/210—International Search Report—Jul. 4, 2007.
PCT/IPEA/409—International Preliminary Report on Patentability—Feb. 25, 2008.
PCT/ISA/237—Written Opinion of the International Searching Authority—Jul. 4, 2007.

* cited by examiner

*Primary Examiner* — Shirley Lu
(74) *Attorney, Agent, or Firm* — Venable LLP; Eric J. Franklin

(57) ABSTRACT

An Intelligent Electronic Device with integrated protection, and/or control, and/or monitoring for two power system primary objects or more power system primary objects, responsive to a plurality of inputs from the power system primary objects, and providing a plurality of outputs to the power system primary objects.

17 Claims, 3 Drawing Sheets

MULTI-OBJECT PROTECTION, CONTROL, AND MONITORING IN THE SAME INTELLIGENT ELECTRONIC DEVICE

FIELD OF THE INVENTION

The present invention relates to electric power transmission and distribution and protection, control, and/or monitoring of elements making up the power transmission and distribution system.

BACKGROUND OF THE INVENTION

Elements of the system for transmission and distribution of electricity, such as bus lines, transfer lines, transformers, circuit breakers, among others, are typically controlled monitored, protected and controlled with intelligent electronic devices (IEDs). The IEDs gather information regarding the elements and detect events and disturbances in the system. Such monitoring, protection and control are essential to maintain a reliable supply of electric power. Disruption of the electric power system can result in disruption to business and people.

Traditionally, an IED handles only one protected or controlled power system primary object. Furthermore, traditionally, an IED is required to handle only protection or control. In some instances, sub-transmission and transmission of electric power are carried out with both protection and control for one power system primary object controlled with one IED. In other situations, distribution of electric power may be carried out with protection and control integrated in one IED. However, still only for one power system primary object.

SUMMARY OF THE INVENTION

The present invention includes that one IED can carry out at least one protection, control or monitoring of a plurality of power system primary objects.

An embodiment of the present invention provides an intelligent electronic device including an input/output module including a plurality of analog and digital input connections and output connections configured to connect the intelligent electronic device to a plurality of power system primary objects. The input/output module receives input from the plurality of power system primary objects and provide output to the plurality of power system primary objects. A disturbance recording module records a plurality of disturbances from a plurality of channels. A processing module is operatively connected to the input/output module and the disturbance recording module. The processing module includes a processor operative to analyze input from the plurality of power system primary objects to carry out at least one of integrated protection, control, or monitoring of the plurality of power system primary objects.

Embodiments of the present invention also relate to a system that includes the IED. A method according to the present invention carries out at least one of protection, control, or monitoring of the plurality of power system primary objects.

Further objectives and advantages, as well as the structure and function of exemplary embodiments will become apparent from a consideration of the description, drawings, and examples.

BRIEF DESCRIPTION OF THE DRAWINGS

The foregoing and other features and advantages of the invention will be apparent from the following, more particular description of an exemplary embodiment of the invention, as illustrated in the accompanying drawings wherein like reference numbers generally indicate identical, functionally similar, and/or structurally similar elements.

DETAILED DESCRIPTION OF EMBODIMENTS OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

It is not known in the art of power transmission and distribution to provide at least one of monitoring, protection, and control of a plurality of power system primary objects with a single intelligent electrical device. This is particularly the case in high voltage applications. Power system objects can include elements of power transmission and/or distribution systems, such as circuit breakers, relays, meters, disconnectors, switches, tap changers and other equipment utilized in power transmission, sub-transmission and/or distribution. IEDs are suitable for environments in which high voltage applications may exist, such as high electromagnetic fields and large temperature variations. IEDs fulfil the main tasks of protection, monitoring and control of power systems and/or devices, which they mostly perform in real time.

Modern technology with high performance processors makes it possible to carry out protection, control, and monitoring one or more power system primary objects integrated in one IED. Cost savings can then be obtained by reducing the number of IEDs in an installation. The figures provide examples of allocation of protection, control, and monitoring for multiple power system primary objects to one IED.

The present invention includes that one IED can be connected to two or more power system primary objects with its analog and binary circuits for protection, and/or control, and/or monitoring of the power system primary objects. Redundancy and independence as required by the utility power system protection and control philosophy is readily included in the IED by instantiating the functionality per IED from the application library following the n−1 criteria. This has previously not been possible due to limitations in the IED for analog and binary channels, which no longer is at hand in some modern IEDs.

According to the present invention, information from two power system primary objects or several power system primary objects may be allocated to one IED. This can reduce the number of IEDs required for an installation. As a result, the cost savings utilizing the present invention may be substantial.

Figure 1:
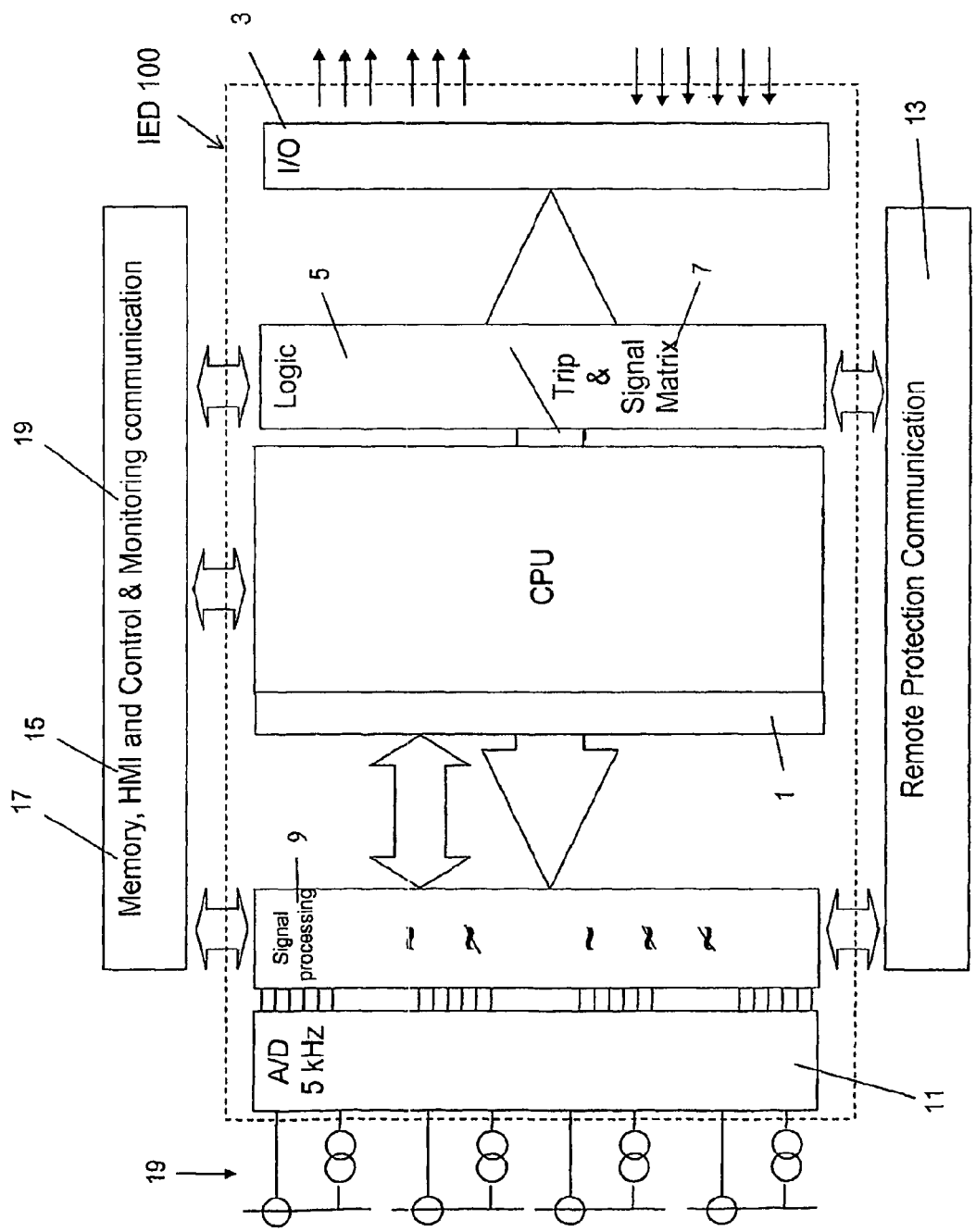
FIG. 1 represents a simple schematic view of an embodiment of a system including an IED according to the present invention.

FIG. 1 represents a simple schematic view of an embodiment of a system including an IED 100 according to the present invention. The embodiment shown in FIG. 1 includes a processing module including a central processing unit (CPU). An IED according to the present invention typically includes only one CPU. The CPU may be a multicore CPU. Typically, the CPU has a clock speed sufficiently great to effectively monitor, control and protect the objects in the power system. According to one embodiment, the CPU has a clock speed of at least 600 MHz. The processing module may also include memory. According to one embodiment, the memory includes 256 Mb DRAM and 64 Mb flash memory. The amount of memory included in the processing module may vary, depending upon requirements.

The IED also includes an input/output module 3 operative to receive input from and send output to the power system objects that the IED is monitoring, controlling and protecting. The input/output module may include a plurality of input/output boards to permit the IED to be connected to a plurality of power system objects. According to one embodiment, the input/output module includes 14 input/output (I/O) boards. The input/output module may include binary input and output. According to other embodiments, the input/output module includes 16 binary inputs, 24 binary outputs or 8 inputs and 12 outputs. These are only examples and the input/output module may include as few or as many inputs and/or outputs as required for an application.

The embodiment of the IED shown in FIG. 1 also includes a logic unit 5 and trip and signal matrix module 7. The logic unit may collect binary signals and combine them into suitable signals for use internally in the IED. The trip and signal matrix module can perform signal conditioning to adapt signals to the communication interfaces and/or to ensure that the signals are within correct voltage input/output range. The trip and signal matrix may collect signals from a number of protection functions and combine them into suitable output signals. This may be particularly utilized to adapt signals for use outside the IED. The logic unit and trip and signal matrix may be operatively connected to the input/output module, the CPU, and remote protection communication module, memory, human machine interface and monitoring communication modules.

The embodiment of the IED shown in FIG. 1 also includes a signal processing unit 9. The signal processing unit may help to analyze signals, choose which signals to process and possibly filter out some signals and permit others to pass to communication interfaces. For example, the filter could utilize any discrete filter utilized in signal processing to filter out desired frequencies or frequency bands. One example of a discrete filter is a Discrete-Fourier-Transform (DFT).
Another example of a filter that could be utilized is a filter to filter out noise from the signals. One example of such a filter is a root-mean-square (RMS) filter. The signal processing unit may be operatively connected to the CPU, the remote protection communication module, memory, human machine interface and monitoring communication modules as well as an analog/digital converter 11.

Analog/digital converter may be connected between the signal processing unit and the circuitry for measuring parameters of primary power system objects to which the IED is monitoring, controlling and/or protecting, such as voltage and current measurement circuitry 19 which measures phase voltages and phase currents of at least two power system primary objects. The analog/digital converter may include a plurality of analog channels. One embodiment includes 24 channels. The analog/digital converter can operate at any frequency that permits the IED to carry out its functions. The exemplary embodiment shown in FIG. 1 operates at a frequency of 5 kHz.

An IED according to the present invention may also include a remote protection communication module 13. This module may be operatively connected to the signal processing unit and the logic and trip and signal matrix modules. These elements may be included for protection schemes or reactions to a fault.

To permit display of data receive from the primary power system objects that the IED controls, monitors and/or protects, a human machine interface (HMI) 15 may be included with the IED. The HMI may be operatively connected to the CPU, logic and signal processing modules. The HMI may also include elements to permit user input to control the primary power system objects. The HMI may include one or more displays to display multiple pages either simultaneously or sequentially that show details and/or permit control of the plurality of primary power system objects. Such in and of itself is new and not known in the prior art.

The IED may include memory 17 for storing temporarily and/or permanently information regarding the primary power system objects monitored, protected and/or controlled. The memory may also store information regarding analysis of data received from the at least one power system primary object. For example, the memory may store information regarding events and/or disturbances, such as time and parameters of the objects that resulted in the detection of an event and/or disturbance. The capacity of the memory module may vary, depending upon the embodiment and requirements or desired functions. One embodiment of the memory module includes disturbance recording for up to 40 analog channels and 100 disturbances. The memory may be operatively connected to the signal processing, CPU, and/or logic modules.

Control and monitoring communication module 19 may be included to provide information to a central control and/or monitoring unit. The control and monitoring communication module may be operatively connected to the signal processing, CPU, and/or logic modules.

An IED according to the present invention may also include a time synchronization module. To obtain an accurate time reference, the time synchronization module may be synchronized with the global positioning system (GPS) to help ensure that the reference time is accurate. The time synchronization module can permit the IED to be synchronized with other IEDs and/or other elements. The time may be utilized to record when events and disturbances occur in the power system, as well as simply keep track of operation of the power system.

A power supply module operatively connects the IED to a power supply.

An IED according to the present invention may also include a current input module for analog current signals. The number of channels in the current input module may vary. One particular embodiment includes 6 channels. The accuracy of the input module may vary. According to one embodiment, the input module has an accuracy of about 0.1%.

Furthermore, an IED according to the present invention may include an optical ethernet module. An ethernet connection is one example of a practical realization of the control & monitoring communication and/or the remote protection communication. In the latter case it could be another IED or any other processing device related to the protection task.

An IED according to the present invention may be configured to fit different protection schemes and architectures in a power system. As described above, the IED may monitor, control and/or protect a plurality of devices. Examples of power system elements that an IED according to the present invention may be connected to include:

transmission lines and cables with one or two circuit breakers;

two and three winding power transformers with up to six inputs;

multi terminal lines with up to six inputs;

composite objects, including line and transformer, generator, transformer blocks; or multi bay applications, including one diameter in breaker and a half or H-station.

Figure 2:
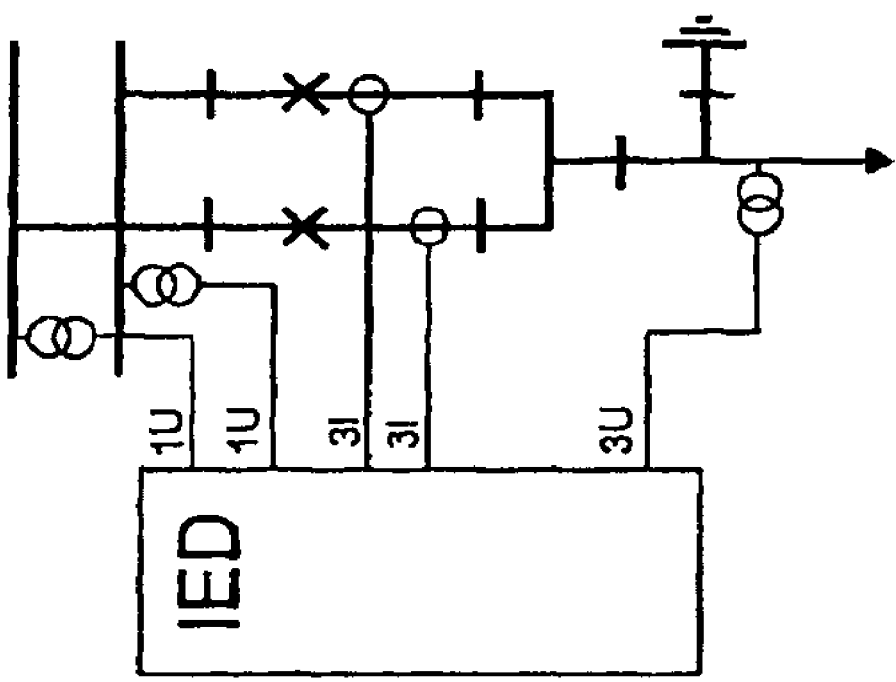
FIG. 2 represents a schematic view of an embodiment of an IED controlling a double circuit breaker.
Figures 3A, 3B:
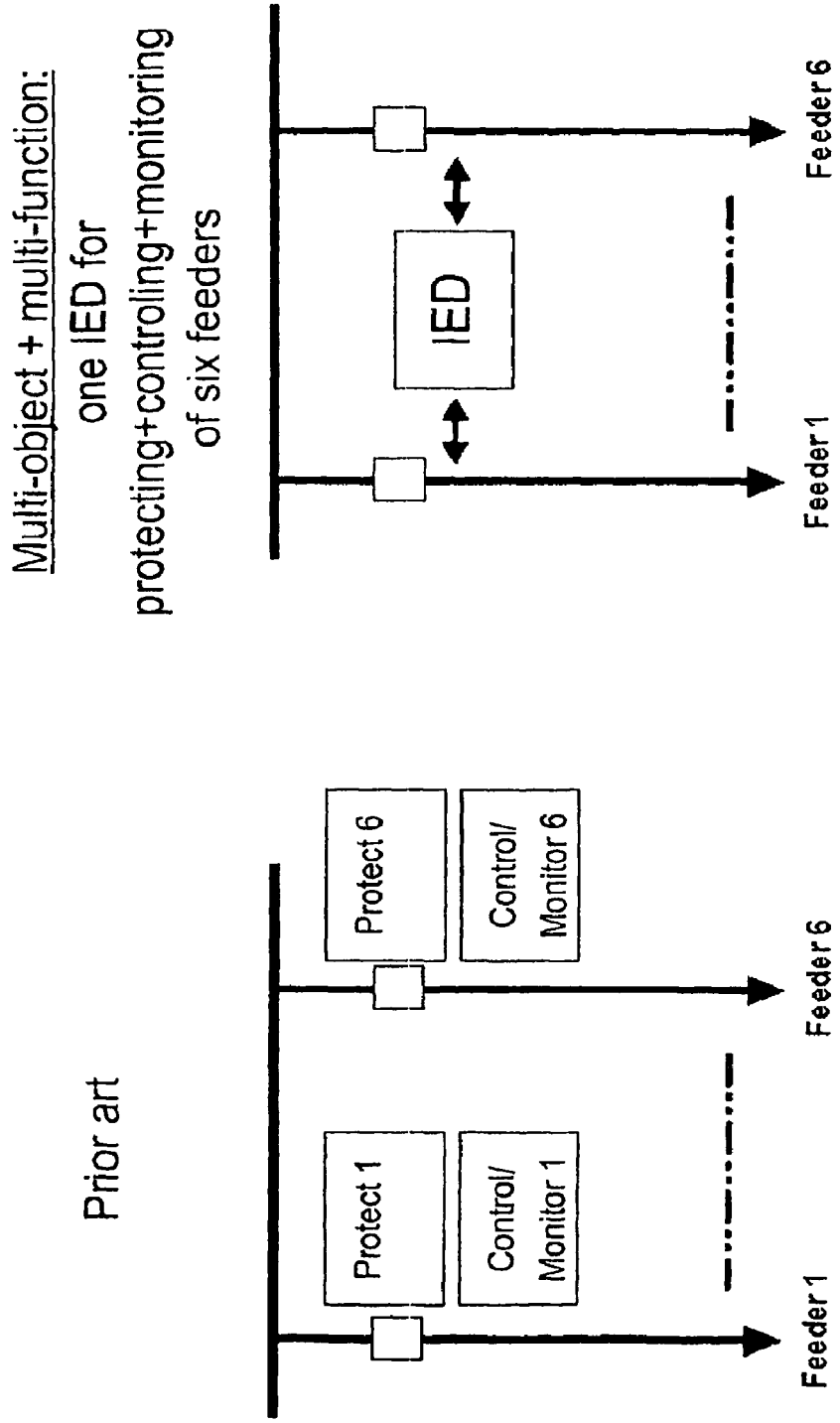
FIGS. 3a and 3b represent schematic diagrams illustrating, respectively, a solution according to the prior art and an embodiment of a solution according to the present invention for protecting, controlling and monitoring six feeders.

FIGS. 2, 3a and 3b illustrate specific examples of IEDs connected to power system elements and also, in some cases, examples of prior art solutions to these applications. FIG. 2 represents a schematic view of an embodiment of an IED controlling a double circuit breaker. FIGS. 3a and 3b represent schematic diagrams illustrating, respectively, a solution according to the prior art and an embodiment of a solution according to the present invention for protecting, controlling and monitoring six feeders. In FIGS. 3a and 3b, only the first and the sixth feeders are represented. Another embodiment of a solution according to the present invention may also be for protecting, controlling and monitoring two main lines. A further embodiment of a solution according to the present invention may be for redundantly protecting, controlling and monitoring two main lines. A still further embodiment of a solution according to the present invention may be for protecting, controlling and monitoring a plurality of diverse power system objects.

As can be seen in these solutions, the present invention can greatly reduce the amount of hardware necessary to monitor, control and/or protect power system elements. The present invention can also still provide redundancy in the system. For example, each IED can protect one of the lines at different mains such that if one IED fails, the IED still protects both lines.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

What is claimed is:

1. An intelligent electronic device for high voltage applications and high electromagnetic field environments, comprising:
   an input and output module comprising a plurality of analog and digital input connections and output connections configured to connect the intelligent electronic device to a plurality of high voltage power system primary objects, the input and output module being operative to receive input from the plurality of power system primary objects to monitor the plurality of power system primary objects and to provide output to the plurality of power system primary objects to control the plurality of power system primary objects, wherein the power system primary objects comprise elements of at least one of power transmission or distribution systems;
   a disturbance recording module operative to record a plurality of disturbances from a plurality of channels;
   a processing module operatively connected to the input and output module and the disturbance recording module, the processing module comprising a processor operative to analyze input from the plurality of power system primary objects to carry out integrated protection, control, or monitoring of the plurality of power system primary objects;
   a memory module configured to store information from the plurality of power system primary objects;
   a signal processing unit configured to analyze and filter signals from the plurality of power system primary objects;
   an interface module operatively connected to the plurality of power system primary objects and to the processing module to simultaneously or sequentially display information regarding the plurality of power system primary objects and receive user input to control the plurality of power system primary objects;
   an analog/digital conversion module operatively connected to the input module, the processor and the plurality of power system primary objects; and
   a remote protection communication module operative to carry out protection schemes or reactions to a fault.

2. The intelligent electronic device according to claim 1, further comprising:
   a remote protection communication module operative to carry out protection schemes or reactions to a fault.

3. The intelligent electronic device according to claim 1, further comprising:
   a time synchronization module.

4. The intelligent electronic device according to claim 1, further comprising:
   a transformer input module operatively connected to at least one transformer to receive input from the at least one transformer.

5. The intelligent electronic device according to claim 1, further comprising:
   data communication module.

6. The intelligent electronic device according to claim 1, further comprising:
   a power supply module.

7. The intelligent electronic device according to claim 1, further comprising:
   an optical ethernet module.

8. The intelligent electronic device according to claim 1, further comprising:
   a serial communication module.

9. The intelligent electronic device according to claim 1, wherein the intelligent electronic device is operatively connected to a double circuit breaker.

10. The intelligent electronic device according to claim 1, wherein the plurality of power system primary objects comprises a plurality of feeders.

11. The intelligent electronic device according to claim 1, wherein the plurality of power system primary objects comprises a plurality of power lines.

12. The intelligent electronic device according to claim 1, wherein the disturbance recording module records up to 40 analog channels.

13. The intelligent electronic device according to claim 1, wherein the disturbance recording module records up to 100 disturbances.

14. The intelligent electronic device according to claim 1, wherein the input and output unit comprises up to 14 input and output boards.

15. A system for integrated protection, control, and monitoring of elements of a system for electric power transmission and distribution, the system comprising:
   a plurality of high voltage power system primary objects; and an intelligent electronic device for high voltage applications and high electromagnetic field environments connected to the plurality of power system primary objects, the intelligent electronic device comprising an input and output module comprising a plurality of analog and digital input connections and output connections configured to connect the intelligent electronic device to the plurality of power system primary objects, the input and output module being operative to receive input from the plurality of power system primary objects to monitor the plurality of power system primary objects and to provide output to the plurality of power system primary objects to control the plurality of power system primary objects, wherein the power system primary objects comprise elements of at least one of power transmission or distribution systems, a disturbance recording module operative to record a plurality of disturbances from a plurality of channels, a processing module operatively connected to the input and output module and the disturbance recording module, the processing module comprising a processor operative to analyze input from the plurality of power system primary objects to carry out integrated protection, control, or monitoring of the plurality of power system primary objects, a memory module configured to store information from the plurality of power system primary objects, a signal processing unit configured to analyze and filter signals from the plurality of power system primary objects, an interface module operatively connected to the plurality of power system primary objects and to the processing module to simultaneously or sequentially display information regarding the plurality of power system primary objects and receive user input to control the plurality of power system primary objects, an analog/digital conversion module operatively connected to the input module, the processor and the plurality of power system primary objects, and a remote protection communication module operative to carry out protection schemes or reactions to a fault.

16. The system according to claim 15, wherein the elements of at least one of power transmission or distribution systems are selected from circuit breakers, relays, meters, disconnectors, switches, tap changers or other equipment utilized in power transmission, sub-transmission and/or distribution.

17. The intelligent electronic device according to claim 1, wherein the elements of at least one of power transmission or distribution systems are selected from circuit breakers, relays, meters, disconnectors, switches, tap changers or other equipment utilized in at least one of power transmission, sub-transmission or distribution.

* * * * *